(12) United States Patent
Park

(10) Patent No.: US 7,056,841 B2
(45) Date of Patent: Jun. 6, 2006

(54) METHOD FOR FABRICATING SEMICONDUCTOR DEVICE

(75) Inventor: Kang Tae Park, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 29 days.

(21) Appl. No.: 10/879,858

(22) Filed: Jun. 29, 2004

(65) Prior Publication Data

US 2005/0233573 A1    Oct. 20, 2005

(30) Foreign Application Priority Data

Apr. 19, 2004   (KR) ................ 10-2004-0026542

(51) Int. Cl.
*H01L 21/76* (2006.01)
*H01L 21/469* (2006.01)

(52) U.S. Cl. ............... 438/783; 438/423; 438/766; 438/575

(58) Field of Classification Search .............. None
See application file for complete search history.

(56) References Cited

U.S. PATENT DOCUMENTS

| | | | | |
|---|---|---|---|---|
| 5,691,252 A | * | 11/1997 | Pan ........................ | 438/243 |
| 5,821,585 A | * | 10/1998 | Maegawa .................. | 257/347 |
| 2005/0167742 A1 | * | 8/2005 | Challa et al. ............. | 257/328 |

* cited by examiner

*Primary Examiner*—Ha Tran Nguyen
(74) *Attorney, Agent, or Firm*—Ladas & Parry LLP

(57) ABSTRACT

A method for fabricating a semiconductor device for reducing coupling noise resulting from high integration of devices, comprises the steps of forming a plurality of metal wiring leads spaced from each other by a predetermined distance and arranged on a semiconductor substrate having a predetermined under layer; forming an insulating interlayer on an entire surface of the semiconductor substrate so that the metal wiring leads are covered with the insulating interlayer; and ion-implanting conductive impurities having a plurality opposite to each other into side end layers of the insulating interlayer disposed between the metal wiring leads so as to reduce the internal charges electrified due to an applied external electric field.

8 Claims, 3 Drawing Sheets

METHOD FOR FABRICATING SEMICONDUCTOR DEVICE

BACKGROUND OF THE INVENTION

1. Field of the Invention

The present invention relates generally to a method for fabricating a semiconductor device, and more particularly to a method for fabricating a semiconductor device that can reduce coupling noise between metal wiring that may result from higher degrees of device integration.

2. Description of the Background Art

As semiconductor devices become more highly integrated, the size of the semiconductor device becomes reduced. Also, as the size of a semiconductor device is reduced, the dimensions and interval between adjacent metal wiring leads, which are voltage feeding sources, are essentially shortened.

However, since a pair of neighboring metal wiring leads and an insulating interlayer interposed between the neighboring metal wiring leads operate together as a capacitor, parasitic capacitance increases if the interval between the metal wiring leads is shortened. Therefore, the coupling noise and interference between the adjacent metal wiring leads increases, so that RC-delay of the metal wiring leads and crosstalk between the metal wirings leads may occur.

In practice, since a DRAM includes a lower layer metal wiring leads and an upper layer metal wiring leads, which are twisted with each other while forming a resulting shape, and the combined metal wiring leads have long lengths, signal distortion may occur due to an increase in the parasitic capacitance. Accordingly, desirable device characteristics are affected negatively.

Accordingly, in order to reduce the coupling noise between the metal wiring leads that occurs in highly integrated devices, that is, in order to prevent the parasitic capacitance from increasing, low dielectric constant materials, having a dielectric constant lower than the dielectric constant (typically $\in=3.5\sim4.4$) of a silicon oxide layer ($SiO_2$), has been currently developed for an insulating interlayer.

However, since a material to be replaced with the silicon oxide layer is only under development work without being currently commercially available, problems of RC-delay and crosstalk, resulting from the coupling noise between metal wiring leads, are not easily solved. Therefore, desirable device characteristics are not ensured.

SUMMARY OF THE INVENTION

Accordingly, the present invention has been made to solve the above-mentioned problems occurring in the prior art, and a first object of the present invention is to provide a method for fabricating a semiconductor device that can reduce coupling noise between metal wiring leads resulting from high integration of the devices.

Also, a second object of the present invention is to provide a method for fabricating a semiconductor device that can ensure desirable device characteristics by reducing coupling noise between metal wiring leads.

In order to accomplish these objects according to an aspect of the present invention, there is provided a method for fabricating a semiconductor device for reducing coupling noise between metal wiring leads resulting from increased integration of devices, the method comprising the steps of: forming a plurality of metal wiring leads spaced from each other by a predetermined distance and arranged on a semiconductor substrate; forming an insulating interlayer on the entire surface of the semiconductor substrate so as to cover the metal wiring leads with the insulating interlayer; and ion-implanting conductive impurities having a polarity opposite to each other into either side end layers of the insulating interlayer between the metal wiring leads so as to reduce the internal charges generated in the dielectric due to an external electric field.

Herein, the coupling noise between the metal wiring leads is controlled through the ion implantation process by adjusting at least one parameter selected from the group consisting of position, energy, and dose of ion implantation.

In order to accomplish these objects according to another aspect of the present invention, there is provided a method for fabricating a semiconductor device for reducing coupling noise between metal wiring leads derived from high integration of devices, the method comprising the steps of: forming a plurality of lower metal wiring leads spaced from each other by a predetermined distance and arranged on a semiconductor substrate; forming a first insulating interlayer on an entire surface of the semiconductor substrate so that the lower metal wiring leads are covered with the first insulating interlayer; forming a plurality of upper metal wiring leads spaced from each other by a predetermined distance and arranged on the first insulating interlayer; and forming a second insulating interlayer on the first insulating interlayer so that the upper metal wiring leads are covered with the second insulating interlayer, wherein conductive impurities having a polarity opposite to each other are ion-implanted into either sides of the first insulating interlayer between the lower metal wiring leads, in both sides of the first insulating interlayer and in the second insulating interlayer between the lower metal wiring leads and the upper metal wiring leads, and both side end layers of the second insulating interlayer between the upper metal wiring leads.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
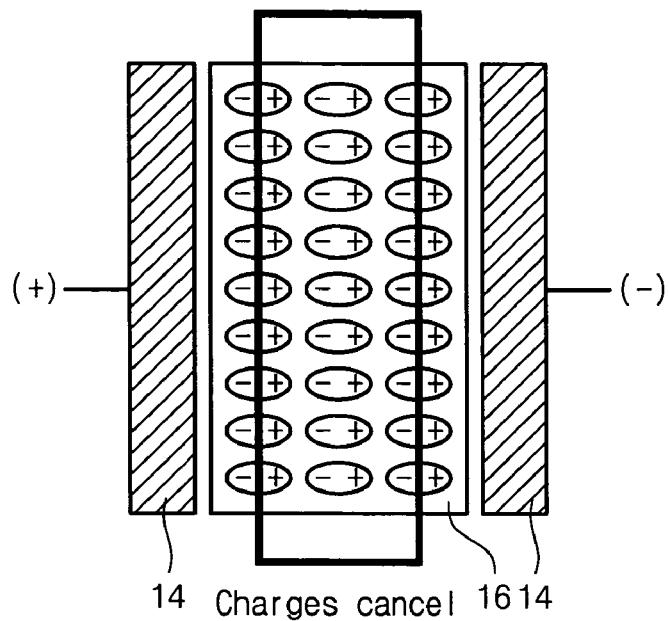
FIG. 1 is a schematic view showing a state of electric charge polarization caused by an external electric field in the inside of a dielectric material of a parallel plate capacitor.

Hereinafter, a preferred embodiment of the present invention will be described with reference to the accompanying drawings. In the following description and drawings, the same reference numerals are used to designate the same or similar components, and so repetition of the description on the same or similar components will be omitted.

First, a technical principle of the present invention will be briefly described. According to the present invention, conductive impurities having a polarity opposite to each other are ion-implanted into a layer disposed at either side of an insulating interlayer interposed between metal wiring leads, that is, both of the side layers of the dielectric material used for forming a capacitor are arranged so as to cancel electric charges caused by polarization due to an external electric field in the inside of the dielectric. Therefore, coupling noise between metal wiring leads is reduced, so that problems resulting from high integration of devices, such as RC-delay and cross talk, are minimized.

In detail, FIG. 1 is a view showing a state of electric charge polarization caused by an external electric field in the inside of a dielectric of a parallel plate capacitor. As shown in FIG. 1, all the polarized electric charges are cancelled in the part of dielectric 16 enclosed in the rectangular box except for the two side layers outside thereof, but as a result, both the side end layers of the dielectric 16 are charged with electric charge having a polarity opposite to the polarity of the exterior electrically charged lead 14. Herein, the amount of electric charges stored in the capacitor varies depending on an amount of electric charge provided by the electrified leads 14, that is, depending on the degree of polarization, and a material having a greater dielectric constant has a greater degree of polarization.

Therefore, according to the present invention, conductive impurities having a polarity opposite to the polarity of the electric charges that are electrified due to an external electric field are ion-implanted into both side layers of an insulating interlayer between metal wiring leads. These layers are disposed at both ends of the dielectric, that is, both between the central portion and each of the leads 14, so as to reduce an amount of charges at the end layers of the dielectric. Accordingly, coupling noise between the metal wiring is reduced.

Figure 2:
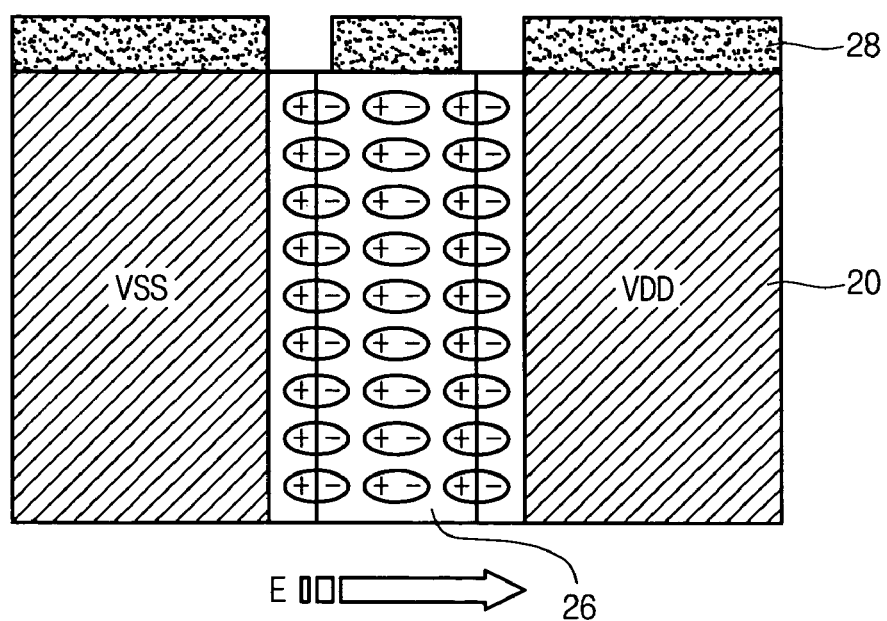
FIGS. 2 and 3 are schematic cross-sectional views illustrating a method for reducing coupling noise between metal wiring leads according to the present invention.
Figure 3:
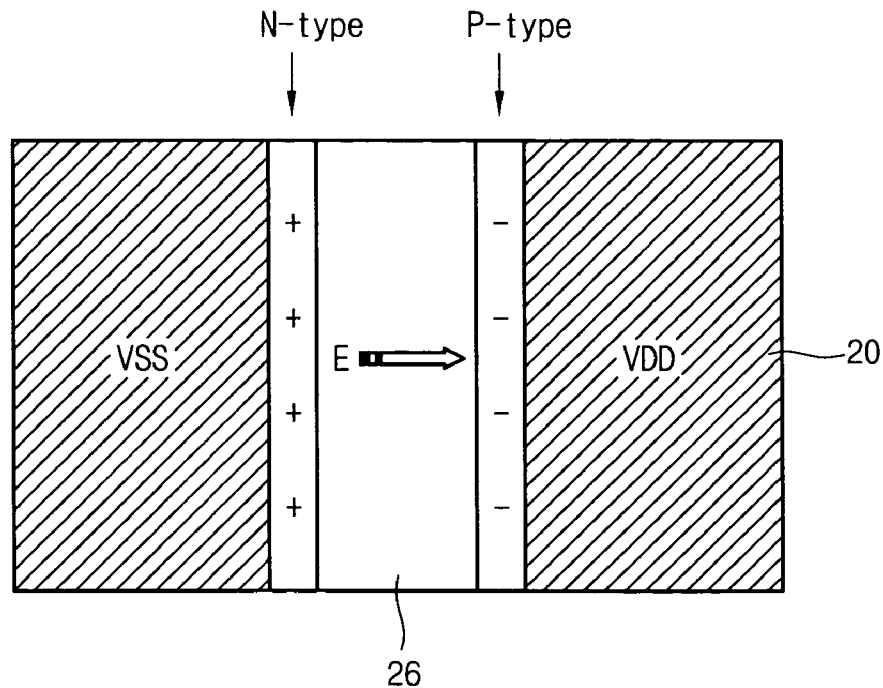

FIGS. 2 and 3 are cross-sectional schematic views illustrating a method for reducing coupling noise between metal wiring leads according to the present invention. Herein, FIG. 2 shows a state in which a photoresist pattern 28 is used for exposing both end layers of the dielectric material adjacent the metal wiring leads and over the dielectric has been formed. FIG. 3 shows the capacitor after ion-implanting impurities have been implanted into both side layers of the dielectric.

In contrast, as shown in FIG. 3, conductive impurities having a polarity opposite to of the plurality of the electric charges are created due to the polarization characteristics of an applied external electric field in dielectric 26. These impurities are forcefully ion-implanted into both ends of dielectric 26, so that charges in both side end layers of the dielectric 26 are considerably reduced. Accordingly, it can be understood that the internal electric field generated in the dielectric 26 is relatively reduced.

Herein, the degree of the internal electric field in dielectric 26 can be controlled by adjusting different parameters, such as the position, energy, and dose of the ion implantation.

In FIGS. 2 and 3, reference numerals 20, 26, and 28 represent metal wiring leads, dielectric, and a photoresist film pattern, respectively.

As a result, according to the present invention, conductive impurities having a plurality opposite to the plurality of the electric charges that are electrified due to an applied external electric field are ion-implanted into both side end layers of an insulating interlayer interposed between metal wiring leads, since both ends of the dielectric form a parasite capacitor, the internal electric field generated in the dielectric can be reduced. Accordingly, coupling noise between metal wiring leads can be reduced, so that desirable device characteristics can be improved.

Figure 4:
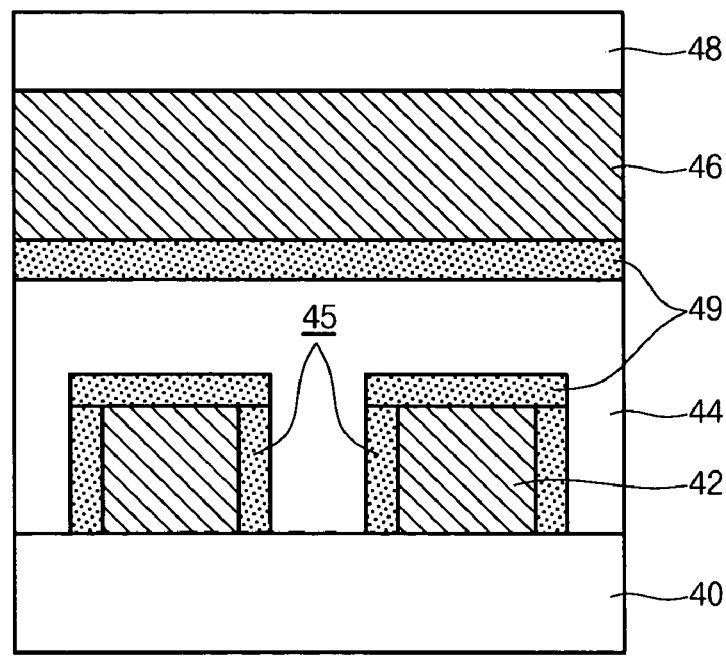
FIGS. 4 and 5 are cross-sectional views obtained by cutting a multi-layer metal wiring lead structure formed according to the present invention along the x- and y-axis directions.
Figure 5:
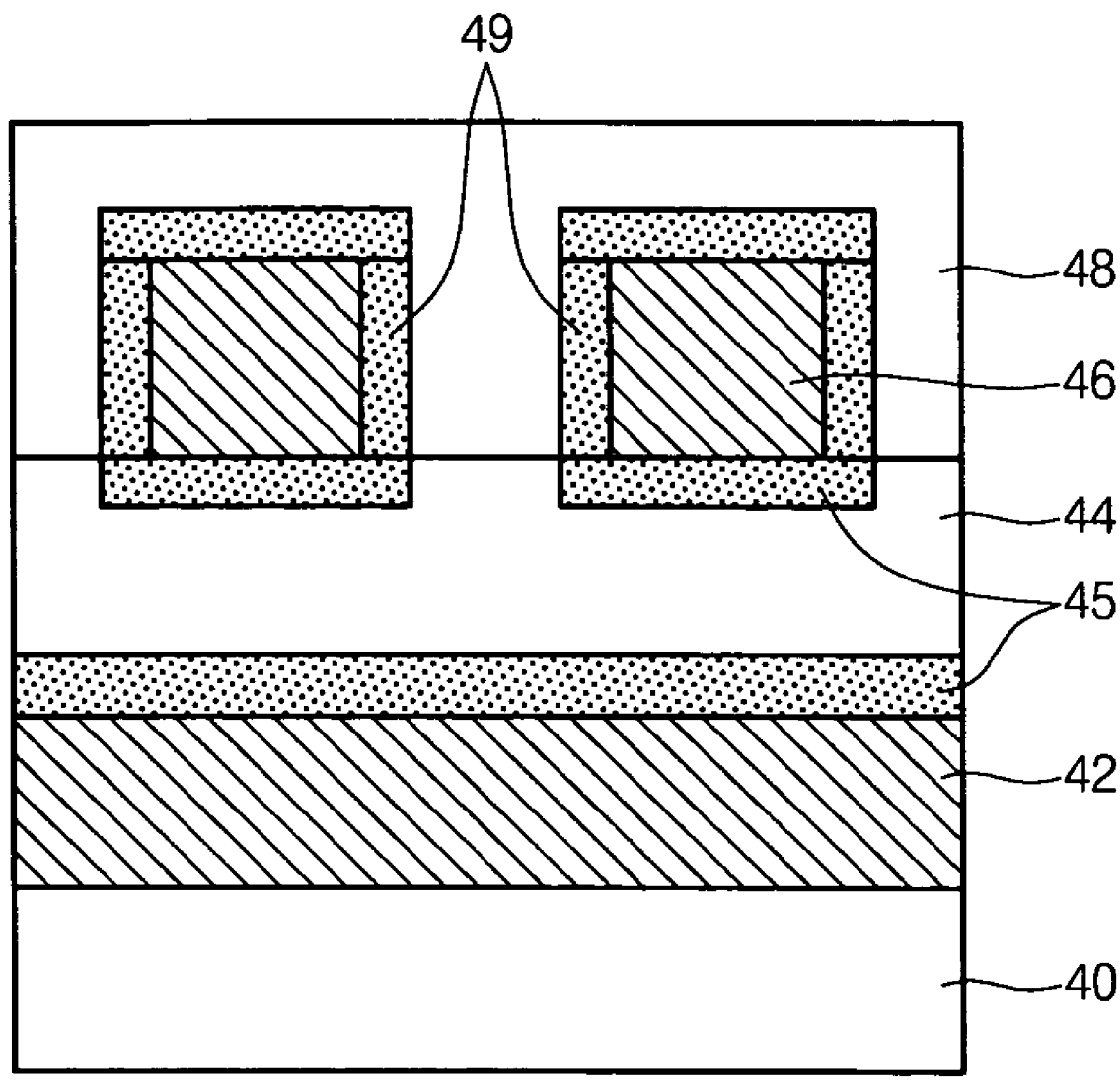

FIGS. 4 and 5 are cross-sectional views obtained by cutting a multi-layer metal wiring structure formed according to the present invention along the x- and y-axis directions.

Referring to FIG. 4, a first ion implantation layer 45 has been formed by ion-implanting N- and P-type impurities into both sides of a first insulating interlayer 44 interposed between two sets of lower metal wiring leads 42. Also, second ion implantation layers 49 have been formed by ion-implanting N- and P-type impurities into layers disposed at both sides of the first insulating interlayer 44 and a second insulating interlayer 48 is interposed above an upper metal wiring 46.

Referring to FIG. 5, the first ion implantation layer 45 has been formed by ion-implanting N- and P-type impurities into both side layers of the first insulating interlayer interposed between the lower metal wiring 42 and the upper metal wiring leads 46. Also, the second ion implantation layer 49 has been formed by ion-implanting N- and P-type impurities into both sides of the second insulating interlayer 48 interposed between the two sets of upper metal wiring leads 46.

As described above, the internal electric field of insulating interlayers interposed between metal wirings leads 42 and 46 is reduced by forming the first and the second ion implantation layers 45 and 49. Therefore, coupling noise between the metal wiring leads is reduced.

At this time, as described above, the degree of internal electric field generated in the insulating interlayers interposed between metal wiring leads is reduced, that is, the reduction of degree of coupling noise between metal wiring leads can be controlled by adjusting the parameters of ion-implantation, such as position, energy, and dose of ion implantation.

As described above, according to the present invention, conductive impurities having a polarity opposite to the polarity of the internal charges electrified by an external electric field are ion-implanted into both side end layers of an insulating interlayer interposed between metal wiring leads, so that internal electric fields generated in the dielectric can be reduced. Accordingly, coupling noise between metal wiring leads can be reduced, so that desirable device characteristics can be ensured.

Although a preferred embodiment of the present invention has been described for illustrative purposes, those skilled in the art will appreciate that various modifications, additions and substitutions are possible, without departing from the scope and spirit of the invention as defined by the following claims.

What is claimed is:

1. A method of fabricating a semiconductor device so as to reduce coupling noise between metal leads, the method comprising the steps of:
   i) forming a first metal lead having a first side portion and a first top portion on a semiconductor substrate; and forming a second metal lead having a second side portion and a second top portion on a semiconductor substrate, wherein the first and second side portions of the metal leads are spaced from each other by a predetermined distance;
   ii) forming a first insulating interlayer on the entire surface of the semiconductor substrate so as to cover the first and second metal leads with the first insulating interlayer; and
   iii) ion-implanting conductive impurities in portions of the first insulating interlayer contacting each of the first side portion and the second side portion, wherein the polarity of the implanted impurity in the portion of the first insulating interlayer contacting the first side portion is opposite the polarity of the implanted impurity in the portion of the first insulating interlayer contacting the second side portion so as to reduce the internal charges in the first insulating interlayer that are electrified due to external electric field applied by the first and second metal leads.

2. The method as claimed in claim 1, wherein, in step iii), the polarity of the implanted impurity in each portion of the first insulating interlayer is opposite the polarity of the respective side portion of the metal leads to which the portion of the first insulating interlayer is contacted.

3. The method as claimed in claim 1, wherein, in step iii), the coupling noise between the metal leads is controlled by adjusting any one parameter selected from the group consisting of position, energy, and dose of ion implantation.

4. The method as claimed in claim 1, further comprising the steps of:
   iv) forming a third metal lead having a third side portion and a third bottom portion on the first insulating interlayer;
   v) ion-implanting conductive impurities in portions of the first insulating interlayer contacting each of the first top portion, the second top portion, the third bottom portion, wherein the polarity of the implanted impurity in the portions of the first insulating interlayer contacting respectively the first top portion and the second top portion is opposite the polarity of the implanted impurity in the portions of the first insulating interlayer contacting the third bottom portion so as to reduce the internal charges in the first insulating interlayer that are electrified due to external electric field applied by (1) the first and second metal leads and (2) at least the third metal lead.

5. The method as claimed in claim 4, further comprising the steps of:
   vi) forming a fourth metal lead having a fourth side portion on the first insulating interlayer, wherein the third and fourth side portions are spaced from each other by a predetermined distance;
   vi) forming a second insulating interlayer on the entire surface of the semiconductor substrate so as to cover the third and fourth metal leads with the second insulating interlayer; and
   vii) ion-implanting conductive impurities in portions of the second insulating interlayer adjacent each of the third side portion and the fourth side portion, wherein the polarity of the implanted impurity in the portion of the second insulating interlayer contacting the third side portion is opposite the polarity of the implanted impurity in the portion of the second insulating interlayer contacting the fourth side portion so as to reduce the internal charges in the second insulating interlayer that are electrified due to external electric field applied by the third and fourth metal leads.

6. The method as claimed in claim 5, wherein the polarity of the implanted impurity in the portion of the second insulating interlayer is opposite the polarity of the respective side portion of the metal leads to which the portion of the second insulating interlayer is contacted.

7. The method as claimed in claim 5, wherein, the coupling noise between the metal leads is controlled by adjusting at least one parameter of the ion implantation, the parameters being selected from the group consisting of position, energy, and dose of the ion implantation.

8. The method as claimed in claim 4, wherein the coupling noise between the metal leads is controlled by adjusting at least one parameter of the ion implantation, the parameters being selected from the group consisting of position, energy, and dose of the ion implantation.

* * * * *